United States Patent
Tiemann

Patent Number: 5,917,317
Date of Patent: Jun. 29, 1999

[54] RETARDING MAGNET ASSEMBLY FOR ELECTRICITY METER

[75] Inventor: Jerome Johnson Tiemann, Schenectady, N.Y.

[73] Assignee: General Electric Company, Schenectady, N.Y.

[21] Appl. No.: 08/801,273

[22] Filed: Feb. 18, 1997

[51] Int. Cl.$^6$ ............................. G01R 1/16; G01R 11/02
[52] U.S. Cl. ........................................... 324/137; 324/152
[58] Field of Search ..................................... 324/152, 137

[56] References Cited

U.S. PATENT DOCUMENTS 2,284,893  6/1942  Barnes ..................................... 324/152

Primary Examiner—Walter E. Snow
Attorney, Agent, or Firm—Marvin Snyder; Douglas E. Stoner

[57] ABSTRACT

A retarding magnet assembly includes magnets configured to apply a constant drag on the rotating disk of an electromechanical electricity meter. The assembly includes upper and lower keepers secured to opposing extensions of the meter frame. A spacer is secured, at a first end, to the upper keeper, and a non-magnetic flexure spring is secured to a second end of the spacer. A pair of upper magnets are secured to the flexure spring member at opposing ends. A pair of lower magnets are secured to the lower keeper at opposing ends. The meter rotating disk extends between the upper and lower magnets. The equilibrium point of the flexure spring changes, depending on strength of the upper magnets and their consequent attraction to the upper keeper. Thus, if the upper magnets becomes stronger due to a temperature change, the attraction of the upper magnets to the upper keeper increases, and the upper magnets move closer to the upper keeper. Since the upper keeper is mounted rigidly with respect to the disk, this motion results in the upper magnets moving away from the disk, which in turn reduces the strength of the magnetic forces from the upper magnets on the disk. By increasing the distance between the upper magnets and the disk when the magnetic strength of the upper magnets increases, a substantially constant drag is exerted on the disk. Similarly, if the upper magnets decrease in strength, the upper magnets move away from the upper keeper, reducing the distance between the upper magnets and the disk.

16 Claims, 1 Drawing Sheet

RETARDING MAGNET ASSEMBLY FOR ELECTRICITY METER

FIELD OF THE INVENTION

This invention relates generally to electricity meters and, more particularly, to retarding magnets for electromechanical type watthour meters.

BACKGROUND OF THE INVENTION

Electromechanical watthour meters typically include an aluminum disk supported on a shaft and driven, or rotated, by an electromagnetic field at a speed proportional to the electric power being consumed by a load. Geared dials, or cyclometer discs, integrate the disk motion to indicate the total energy consumed, typically in kilowatt hours. In addition to a kilowatt hour measure of consumption, some meters include demand registers, time-of-use registers, or other registers for recording other energy consumption related data. Such registers can be either mechanical or electrical. Electromechanical watthour meters and registers are well known and commercially available from General Electric Company, Somersworth, N.H.

The aluminum disk is connected to a shaft which is supported on bearings. A voltage coil and a current coil are positioned on respective, opposite sides of the disk. In a residential metering application, two power lines extending from a distribution transformer are utilized to deliver energy from the power system to the residence. The meter voltage coil is electrically connected across the lines, and the current coil is electrically connected in series with one of the lines. A permanent magnet, sometimes referred to as a retarding magnet, is spaced from the voltage and current coils and is positioned so that its poles are on opposite sides of the disk.

In operation, the magnetic fields from the voltage and current coils induce currents in the rotational disk, and the currents in the disk set up associated magnetic fields. The magnetic fields of the voltage and current coils couple with the magnetic fields of the induced disk currents, resulting a rotational torque being applied to the disk. In addition, the fields produced by the permanent magnet generate a retarding torque on the disk.

Using the above described configuration, a highly accurate measurement of energy consumption is generated. Specifically, each complete revolution of the disk corresponds to a predetermined quantity of energy consumed. The meter register, by precisely measuring disk revolutions, generates an accurate measure of energy consumption.

While it is important to generate an accurate measurement of energy consumption, it also is desirable to employ a meter structure that allows energy consumption to be measured in a cost efficient manner. In attempting to achieve a low cost meter, however, accuracy of the meter must not be adversely affected, nor should operational energy requirements of the meter itself be increased, e.g., meter energy consumption should not be increased in order to lower meter cost. Substituting lower cost meter components for components that are critical in generating accurate energy consumption measurements will typically result in less accurate metering. For example, it is important that the retarding magnet generate a constant retarding torque, or drag, on the disk under various conditions, including a variety of environments having a wide range of temperatures. An electricity meter for use in Florida should preferably be manufactured in an identical manner, and use the same components, as a meter for use in Alaska. Therefore, the retarding magnet must have a low temperature coefficient in order to be relatively insensitive to temperature changes.

One alloy used for the retarding magnet, known as Alnico-5, has a low temperature coefficient, but is expensive. Less expensive magnetic material, e.g., ferrite, typically has a higher temperature coefficient than Alnico-5, and due to the importance of maintaining a constant drag on the disk, Alnico-5 is typically selected over ferrite for the retarding magnet. The Alnico-5 magnet is usually secured to the meter frame by an expensive nickel-iron keeper, so that a substantially constant drag is applied to the disk over a wide range of ambient temperatures. This allows the desired accurate metering to be achieved.

It would be desirable to employ a retarding magnet that enables more cost efficient metering of energy consumption. Such retarding magnet assembly, however, should not adversely affect the accuracy of energy consumption metering nor increase the operational energy requirements of the meter itself.

SUMMARY OF THE INVENTION

A retarding magnet assembly which includes magnets configured to apply a constant drag on the rotating meter disk comprises, in one embodiment, upper and lower keepers secured to opposing extensions of the meter frame. A spacer is secured, at a first end, to the upper keeper, and a non-magnetic flexure spring is secured to a second end of the spacer. A first pair of magnets, referred to herein as upper magnets, are secured to the flexure spring member at opposing ends. A second pair of magnets, referred to herein as lower magnets, are secured to the lower keeper at opposing ends. The meter rotating disk extends between the upper and lower magnets.

Since the upper magnets are attached to the flexure spring, then depending on the strength of the upper magnets and their consequent attraction to the upper keeper, the equilibrium point of the flexure spring will change during operation. For example, if the upper magnets become stronger due to a temperature change, the attraction of the upper magnets to the upper keeper will increase, and the upper magnets will move closer to the upper keeper. Since the upper keeper is mounted rigidly with respect to the disk, this motion results in the upper magnets moving away from the disk, which in turn affects magnetic forces from the upper magnets on the disk. That is, if a temperature change causes magnetic strength of the upper magnets to increase, then rather than exerting more drag on the disk, the upper magnets are drawn towards the upper keeper. By thus increasing the distance between the upper magnets and the disk when the magnetic strength of the upper magnets increases, a substantially constant drag is exerted on the disk. Similarly, if the upper magnets decrease in strength, the upper magnets move away from the upper keeper which reduces the distance between the upper magnets and the disk so as to compensate for the decreased magnet strength.

The initial adjustment of the gap between the upper keeper and the upper magnets, which sets the relation between the strength of the magnets and their position with respect to the disk, can be made to compensate for changes in magnetic strength of both the lower and upper magnets. In addition, since the retarding forces are generated mostly from the regions near the polar edges of the upper and lower magnets, short magnets (in a direction parallel to a radius of the disk) are used to provide more efficient retarding action per unit volume. Further, with each magnet, the direction of magnetization in the magnetic material is reversed one or more times along the length of the magnet. In this way, magnets of any desired length can provide efficient retardation per unit volume. By using magnets with multiple flux reversals, substantially higher drag can be achieved, but assuming that a predetermined amount of drag is desired, these magnets can operate with a larger spacing between the magnets and disk. This is advantageous because latitude in spacing increases as the spacing increases. Thus larger tolerances can be allowed in the location of the disk. An additional benefit of using high coercive force magnets is that their magnetization is relatively insensitive to externally applied magnetic fields.

The above described retarding magnet assembly allows use of higher temperature coefficient, lower cost magnets in electricity meter assemblies so as to facilitate more cost efficient metering of energy consumption without adversely affecting metering accuracy or increasing operational energy requirements of the meter itself.

DETAILED DESCRIPTION OF THE DRAWINGS

The retarding magnet assembly of the present invention is described as used in a single phase electromechanical watthour meter typically employed for residential metering. The retarding magnet assembly, however, can be used in other electromechanical type meters, including polyphase meters, and in electromechanical meters incorporating mechanical or electronic registers. Therefore, the retarding magnet assembly is not limited to use in any particular single phase meters nor is the assembly limited to use in just single phase meters.

Figure 1:
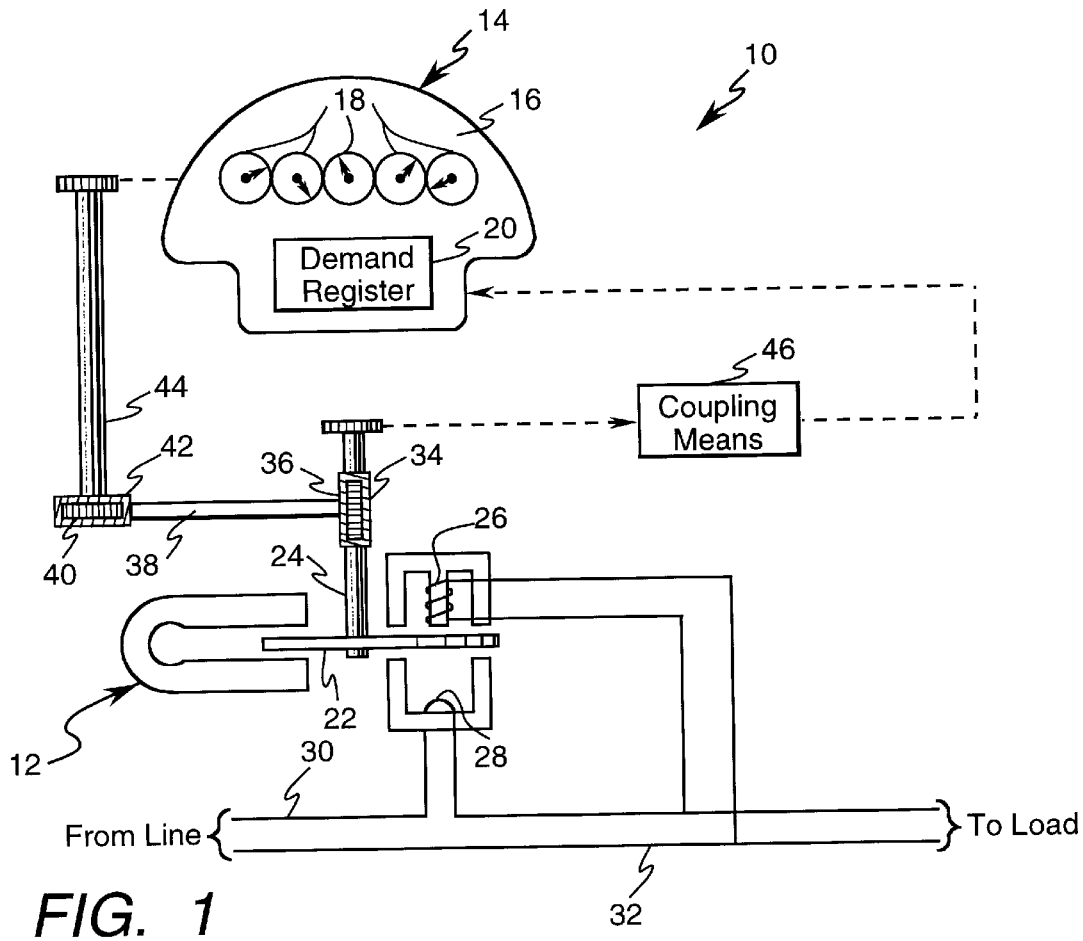
FIG. 1 is a schematic illustration of a known electromechanical watthour meter including a known retarding magnet.

FIG. 1 is a schematic illustration of a single phase electromechanical watthour meter 10, such as an I-70 single phase meter commercially available from General Electric Company, Somersworth, N.H., including a retarding magnet 12 which, as shown, is typically a permanent magnet. Meter 10 further includes a register assembly 14 having a mechanical watthour register 16 with dials 18 and an electronic demand register 20. Meter 10 also includes an aluminum disk 22 connected to a shaft 24 supported on bearings (not shown). A voltage coil 26 and a current coil 28 are positioned on respective, opposite sides of disk 22. In a residential metering application, two power lines 30 and 32 extending from a distribution transformer (not shown) are utilized to deliver energy from the power-providing system to the residence. Meter voltage coil 26 is electrically connected across lines 30 and 32, and current coil 28 is electrically connected in series with line 30. Retarding magnet 12 is positioned so that its poles are on opposite sides of disk 22.

A first worm gear 34, integrally formed on shaft 24, engages a second worm gear 36 of a second shaft 38. A third worm gear 40, formed on second shaft 38, engages a fourth worm gear 42 on a third shaft 44. Third shaft 44 is coupled to mechanical register 16 and drives gears (not shown) connected to dials 18. In addition, coupling means 46 (e.g., an optical assembly for generating pulse signals representative of rotation of disc 22) are provided to couple first shaft 24 to electronic demand register 20.

In operation, magnetic fields from voltage and current coils 26 and 28 induce eddy currents in disk 22. These eddy currents set up magnetic fields which couple with the magnetic fields produced by voltage and current coils 26 and 28, resulting in application of a rotational torque to disk 22. The field produced by retarding magnet 12 generates a retarding torque on disk 22.

Retarding magnet 12 is typically fabricated from Alnico-5 alloy. This alloy has a low temperature coefficient, which facilitates maintaining a constant drag on disk 22 in the presence of fluctuating ambient temperatures. The retarding magnet is typically secured to the meter frame by a nickel-iron keeper (not shown). The resulting structure produces a substantially constant drag on disk 22 across a broad temperature range to achieve the desired accurate metering.

The retarding magnet assembly of the present invention can be employed in meter 10 in place of retarding magnet 12 and its keeper, and can be used in other meter configurations as well. Importantly, the magnet assembly of the present invention is believed to be lower in cost than the known retarding magnet assembly, allowing more cost efficient metering of energy consumption to be achieved without adversely affecting accuracy of energy consumption metering.

Figure 2:
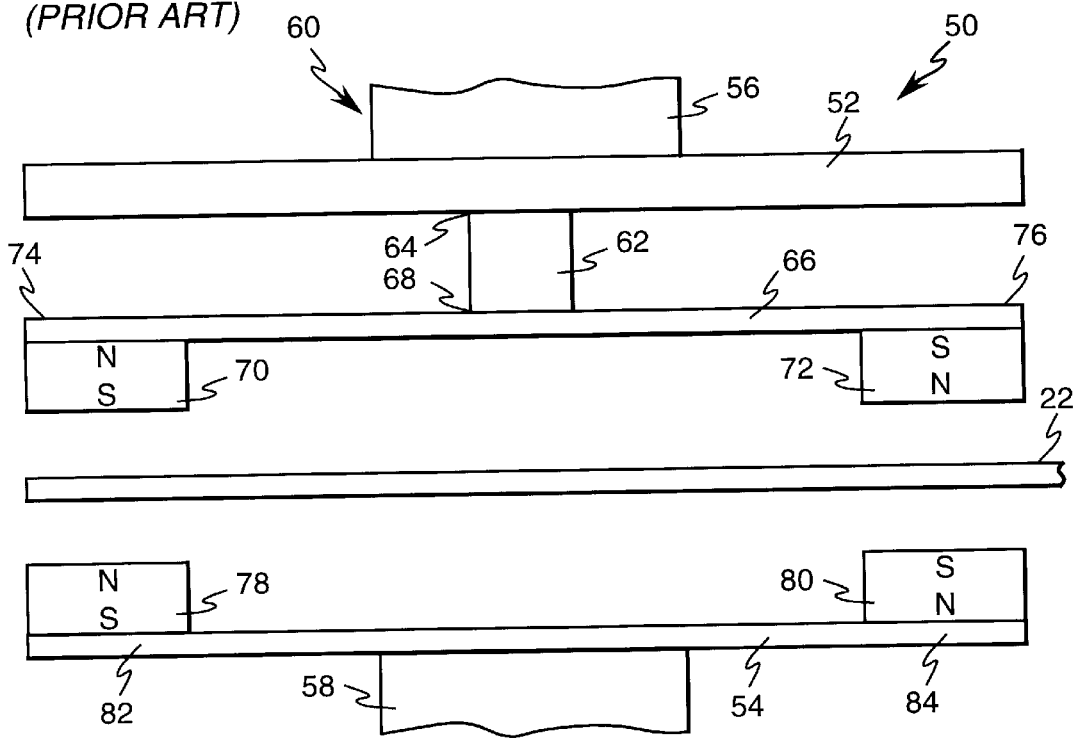
FIG. 2 is an exploded front view of a retarding magnet assembly in accordance with one embodiment of the invention.

FIG. 2 is an exploded front view of a retarding magnet assembly 50 in accordance with one embodiment of the invention. Upper and lower keepers 52 and 54 are secured to opposing extensions 56 and 58, respectively, of a meter frame 60. A spacer 62 is secured, at a first end 64, to upper keeper 52, and a non-magnetic spring member 66, sometimes referred to herein as a flexure spring, is secured to a second end 68 of spacer 62. First and second upper magnets 70 and 72 are secured to spring member 66 at opposing ends 74 and 76, respectively. First and second lower magnets 78 and 80 are secured to lower keeper 54 at opposing ends 82 and 84, respectively. Aluminum disk 22 extends between upper magnets 70 and 72 and lower magnets 78 and 80. An adhesive, such as an epoxy adhesive, for example, can be used to secure spacer 62 to upper keeper 52 and spring member 66, to secure upper magnets 70 and 72 to spring member 66, and to secure lower magnets 78 and 80 to lower keeper 54.

In an exemplary embodiment, keepers 52 and 54 and spacer 62 are stamped, for example, from a low cost magnetic material such as steel. Spring member 66 is stamped from non-magnetic material such as bronze, for example. Magnets 70, 72, 78 and 80 are fabricated from a low cost magnetic material such as ferrite. Alternatively, many other materials can be used for such components, and the present invention is not limited to the above referenced materials.

Since upper magnets 70 and 72 are attached to flexure spring 66, then depending on the strength of magnets 70 and 72 and their consequent attraction to keeper 52, the equilibrium point of flexure spring 66 will change during operation of the meter. For example, if the magnetic strength of magnets 70 and 72 increases due to a temperature change, the attraction of magnets 70 and 72 to keeper 52 will increase, moving magnets 70 and 72 closer to keeper 52. Since keeper 52 is rigidly positioned with respect to disk 22, this motion results in magnets 70 and 72 moving away from rotating disk 22, which in turn reduces the magnetic forces from magnets 70 and 72 on disk 22. Thus if a temperature change strengthens the magnetic field produced by magnets 70 and 72, then rather than exerting more drag on disk 22, magnets 70 and 72 are drawn towards keeper 52. By increasing the distance between magnets 70 and 72 and disk 22 when the fields of magnets 70 and 72 strengthen, a substantially constant drag is maintained on disk 22. Similarly, if magnets 70 and 72 decrease in strength, they move away from keeper 52 which reduces the distance between magnets 70 and 72 and disk 22 so as to continue to maintain a substantially constant drag on disk 22.

The initial adjustment of the gap between keeper 52 and magnets 70 and 72, which sets the relation between magnet strength and magnet position, is not orthogonal to the amount of drag on disk 22. Therefore, since both magnet strength and magnet position are set to precise values depending on the desired drag on disk 22, an automated setup may be preferred to manual assembly in order to avoid an iterative, trial and error, approach.

The action of magnets 70, 72, 78 and 80 depends on the interaction of eddy currents induced in disk 22 and the magnetic fields of magnets 70, 72, 78 and 80. Since the induced eddy currents flow only around areas through which magnetic flux is changing with time, there must be a gradient in magnetic field strength through that area in a direction parallel to relative disk motion. For this reason, areas of constant magnetic field do not contribute to the drag produced by retarding magnets 70, 72, 78 and 80. Similarly, areas where the component of the magnetic field perpendicular to the induced current is low do not contribute to drag even if a field gradient exists in those areas. In fact, only areas of magnets 70, 72, 78 and 80 where the field is both strong and changing rapidly-such as at the edges of the magnets-contribute substantially to the drag.

Several magnetic materials, such as ferrites, have coercive forces much greater than their residual magnetic fields, and magnets 70, 72, 78 and 80 made from these materials can be much shorter than Alnico-5 magnets without demagnetizing. Since the retarding forces are generated primarily from the regions near the polar edges, shorter magnets are much more efficient in terms of retarding action per unit volume. There is, of course, a minimum length of magnet material which is effective that is set by the distance between magnets 70, 72, 78 and 80 and disk 22. If each of magnets 70, 72, 78 and 80 is not substantially longer than this spacing, as measured in a direction parallel to a radius of disk 22, the field under one end of a respective magnet 70, 72, 78 and 80 is partially affected by the pole at its other end, and the total field is reduced due to cancellation. But if each magnet 70, 72, 78 and 80 is made longer than the length where cancellation ceases to be a problem, no benefit is achieved by providing this extra magnetic material unless additional regions are provided where there are magnetic field gradients parallel to the direction of disk motion. These additional regions are conveniently provided by utilizing an electromagnetically generated field driven by alternating current to reverse the direction of magnetization in the magnetic material of each magnet 70, 72, 78 and 80 one or more times. In this way, magnets of any desired length can provide efficient retardation per unit volume. By using magnets 70, 72, 78 and 80 with multiple flux reversals, substantially higher drag can be achieved; however, assuming that a predetermined amount of constant drag is desired, magnets 70, 72, 78 and 80 can operate with larger spacing between magnets 70, 72, 78 and 80 and disk 22. This is advantageous because latitude in spacing increases as the spacing increases. Larger tolerances can thus be allowed in the location of disk 22.

An additional benefit of employing magnets 70, 72, 78 and 80 of high coercive force material is that their magnetization is relatively insensitive to externally applied fields. That is, magnets 70, 72, 78 and 80 have low permeability. This means that the gradients in field strength near their polar regions will not be influenced by externally applied fields. Since the drag on disk 22 depends both on the field gradient and the field itself, an applied field in the same direction as that of magnets 70, 72, 78 and 80 will increase the drag, while the drag is decreased where the applied field cancels that of magnets 70, 72, 78 and 80. Therefore, if magnets 70, 72, 78 and 80 have equal field strengths in opposite directions, an external magnetic field will have no net effect on the drag. If the field direction of retarding magnets changes sufficiently often, this cancellation will occur even if the externally applied field has a gradient of its own.

It will be appreciated that keepers 52 and 54 and magnets 70, 72, 78 and 80 may have other geometric shapes, and the present invention is not limited to the shapes illustrated herein. In addition, keepers 52 and 54 and magnets 70, 72, 78 and 80 can be formed using other materials to achieve the desired operational characteristics, i.e., a constant drag on disk 22.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A retarding magnet assembly for an electromechanical meter including a meter frame and a disk rotatable relative to the meter frame, said retarding magnet assembly comprising:

a first keeper secured to the meter frame;

a spring member spaced from and coupled to said first keeper and having opposing ends free to move in a direction toward or away from said first keeper;

first magnet means secured to said spring member at said opposing ends thereof;

a second keeper secured to the meter frame; and second magnet means secured to said second keeper on a side of the rotatable disk opposite said magnet means secured to said spring member.

2. A retarding magnet assembly in accordance with claim 1 further comprising a spacer secured at a first end to said first keeper, said spring member being secured to a second end of said spacer.

3. A retarding magnet assembly in accordance with claim 1 wherein said spring member comprises a flexure spring.

4. A retarding magnet assembly in accordance with claim 1 wherein said first magnet means comprises a first magnet secured to said spring member at a first one of said opposing ends, and a second magnet secured to said spring member at a second one of said opposing ends.

5. A retarding magnet assembly in accordance with claim 4 wherein said second magnet means comprises a first magnet secured to said second keeper at a first end thereof, and a second magnet secured to said second keeper at a second end thereof.

6. A retarding magnet assembly in accordance with claim 1 wherein said first and second magnet means are comprised of ferrite material.

7. A retarding magnet assembly in accordance with claim 1 wherein said first magnet means secured to said spring member is positioned so that as magnetic strength of said first magnet means increases, said first magnet means moves towards said first keeper.

8. A retarding magnet assembly in accordance with claim 1 wherein said first magnet means secured to said spring member is exposed to an electromagnetically generated field so as to undergo multiple flux reversals.

9. An electromechanical electricity meter, comprising:

at least one voltage coil;

at least one current coil;

a disk positioned between said voltage coil and said current coil;

a shaft secured to said disk and rotatable therewith;

a register for generating an indication of energy consumption, said register coupled to said shaft; and a retarding magnet assembly comprising a first keeper secured to the meter frame, a spring member spaced from and coupled to said first keeper and having opposing ends free to move in a direction toward or away from said first keeper, and first magnet means secured to said spring member at said opposing ends thereof.

10. An electromechanical electricity meter in accordance with claim 9 wherein said retarding magnet assembly further comprises a second keeper secured to the meter frame, and second magnet means secured to said second keeper on a side of the rotatable disk opposite said first magnet means.

11. An electromechanical electricity meter in accordance with claim 10 wherein said retarding magnet assembly further comprises a spacer secured at a first end to said first keeper, said spring member being secured to a second end of said spacer.

12. An electromechanical electricity meter in accordance with claim 10 wherein said first magnet means comprises a first magnet secured to said spring member at a first one of said opposing ends and a second magnet secured to said spring member at a second one of said opposing ends, and said second magnet means comprises a first magnet secured to said second keeper at a first end thereof and a second magnet secured to said second keeper at a second end thereof.

13. An electromechanical electricity meter in accordance with claim 9 wherein said spring member comprises a flexure spring.

14. An electromechanical electricity meter in accordance with claim 9 wherein said first magnet means secured to said spring member is positioned so that as the magnetic strength of said first magnet means increases, said first magnet means moves towards said first keeper.

15. An electromechanical electricity meter in accordance with claim 9 wherein said first magnet means secured to said spring member is exposed to an electromagnetically generated field so as to undergo multiple flux reversals.

16. An electromechanical electricity meter in accordance with claim 10 wherein said first and second magnet means are comprised of ferrite material.

* * * * *